United States Patent [19]

Park

[11] Patent Number: 4,954,927

[45] Date of Patent: Sep. 4, 1990

[54] DOUBLE CAPACITOR AND MANUFACTURING METHOD THEREOF

[75] Inventor: Han-su Park, Yulchon, Rep. of Korea

[73] Assignee: Samsung Electronics Co., Ltd., Rep. of Korea

[21] Appl. No.: 359,771

[22] Filed: May 31, 1989

[30] Foreign Application Priority Data

Sep. 16, 1988 [KR] Rep. of Korea ............. 88-12002[U]

[51] Int. Cl.⁵ .................. H01G 4/38; H01G 7/00; H01L 27/02
[52] U.S. Cl. ...................... 361/328; 357/51; 29/25.42
[58] Field of Search ............... 29/25.42; 357/51; 361/502, 311-313, 328-330

[56] References Cited

U.S. PATENT DOCUMENTS

| 4,685,197 | 8/1987 | Tigelaar et al. | 357/51 X |
| 4,686,552 | 8/1987 | Teng et al. | 357/51 X |
| 4,702,937 | 10/1987 | Yamoto et al. | 357/51 X |

FOREIGN PATENT DOCUMENTS

| 89450 | 5/1984 | Japan | 357/51 |
| 293667 | 12/1987 | Japan | 357/51 |
| 87760 | 4/1988 | Japan | 357/51 |

Primary Examiner—Donald A. Griffin
Attorney, Agent, or Firm—Cushman, Darby & Cushman

[57] ABSTRACT

A double capacitor and the method of manufacturing the same contains two capacitors connected in parallel within a semiconductor integrated circuit. A common ground conductor used by both capacitors is formed using a tri-layer mask and sputtering process that gives the conductor a U shape, which results in a larger charging capacity compared with a conventional capacitor using the same chip area.

17 Claims, 4 Drawing Sheets

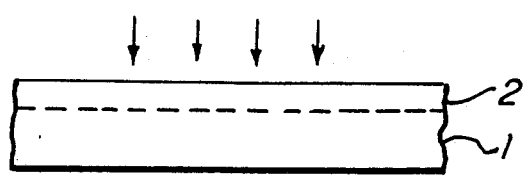
FIG. I(A)
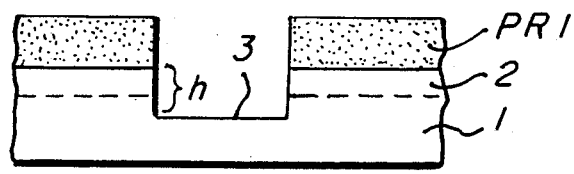
FIG. I(B)
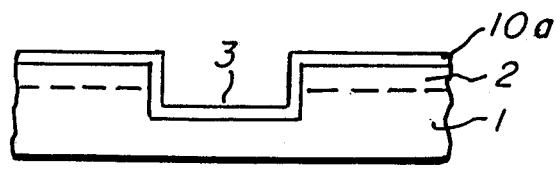
FIG. I(C)
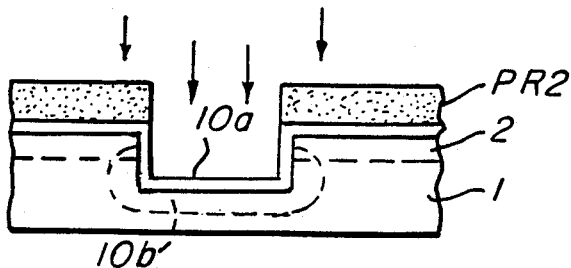
FIG. I(D)

DOUBLE CAPACITOR AND MANUFACTURING METHOD THEREOF

BACKGROUND OF THE INVENTION

1. Field of the invention

The present invention relates to a double capacitor and a method of manufacturing the same. The double capacitor has the capability of storing a large amount of electrical charge in a limited area of an ultra-high density semiconductor device. The invention particularly relates to a double capacitor in which two capacitors are connected in parallel to another circuit element and a method of manufacturing the same using lift off and area compensation technologies that are presently used to produce stacking type capacitors and trench type capacitors.

2. Background of the invention

As the density of the semiconductor memory devices increases, manufacturing technologies have been further refined to produce smaller semiconductor chips having an increased number of circuit elements. The size of memory cells is one important factor influencing the size of semiconductor chips.

One important factor in increasing this density and reducing the size of semiconductor chips is the fabrication techniques used to form capacitors capable of storing large amounts of electrical charge in a limited area.

Ordinary plane capacitors having a small size and large capacitance can be formed by reducing the thickness of the insulating layer an amount proportionally greater than the reduced capacitor area. However, in mega-bit scale semiconductor memory devices, reducing the thickness of the dielectric film to a satisfactory degree and using a material having a high dielectric constant is difficult. Therefore, it has been recognized that the need exists for a structurally new capacitor.

One type of structurally different capacitor that has recently been developed is a cell capacitor having a three dimensional structure, which is represented by stacking type capacitors and trench type capacitors.

The stacking type capacitor has a three dimensional structure on the substrate formed in a 3-layer polycrystalline silicon stack structure that can be used for gating transistors in the storage cell and the like. However, step differences between several layers and minimal improvements in dielectric films have made the use of stacking type capacitors in memory devices of over 4Mb difficult.

The trench type capacitor, which is manufactured using anisotropic silicon etching, also gives an increased effective capacitor area. Further, in the direction of the plane, it provides this increased capacitor area in a narrow space, thereby making it advantageous for semiconductor memory devices having a density over 4Mb. However, a reduced gap between trenches results in leakage currents and processing is difficult and complicated. For instance, the device being manufactured can be damaged or polluted during anisotropic etching using accelerated charged particles. Also, soft errors due to alpha particles are problematic for trench type capacitors.

Related to the use of capacitors in semiconductor memory devices having a high density is the use of transistors with capacitors in a memory cell. Therefore, the connection of the capacitor to the transistor, and the ability to do this using minimum line widths is important. However, if capacitors of the type described above are used, the problems discussed above still exist.

SUMMARY OF THE INVENTION

The present invention uses techniques previously used for fabricating both trench and stacking type capacitors with a lift off process to obtain a double capacitor that can be used, for example, in high density semiconductor memory devices such as DRAM's of several to ten's order mega-bit size.

It is a first object of the present invention to provide a double capacitor for a semiconductor integrated circuit that has a charging capacity over twice that of the conventional capacitors, which allows a reduction in the chip area needed to make the capacitor. This is obtained using a parallel connection of two capacitors to another circuit element in the semiconductor integrated circuit.

It is a second object of the present invention to provide a manufacturing method for the above described double capacitors using existing technology.

The double capacitor for a semiconductor integrated circuit according to the present invention contains a common ground conductor of a "U" shape disposed in a silicon valley or recess formed at the upper portion of a substrate, a first non-conductor disposed under the common ground conductor, and a first conductor disposed in the substrate under the first non-conductor. The second capacitor uses the same common ground conductor as the first capacitor, a second non-conductor disposed on the common ground conductor, and a second conductor disposed on the second non-conductor. With this arrangement the first and second capacitors can be connected in parallel and attached to another circuit element in the semiconductor integrated circuit.

Furthermore, the common ground conductor contains a cross sectional area having both a horizontal and vertical component so that the chip area used by the capacitor is minimized for the same capacitance than previously possible.

The manufacture of this double capacitor includes various different steps of forming masks, etchings, diffusions, sputtering depositions, and etchings, among others in a sequence that provides a the capacitor summarized above.

BRIEF DESCRIPTION OF THE DRAWINGS

The above objects and other advantages of the present invention will become more apparent in the following detailed description of the preferred embodiment of the present invention, with reference to the attached drawings in which:

FIGS. 1(a) to 3(c) illustrate the successive manufacturinG steps for the double capacitor according to the present invention.

DETAILED DESCRIPTION OF THE PREFERRED EMBODIMENT

Figure 2A:
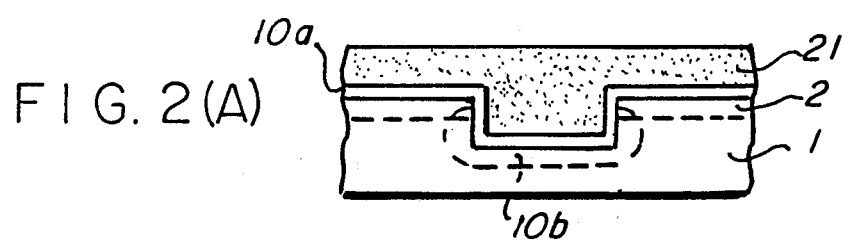

FIGS. 1A to 3C illustrate the manufacturing process steps to obtain the double capacitor according to the present invention.

FIG. 1A illustrates forming a depletion region 2 by diffusing an n-type dopant (or a p-type dopant) into the semiconductor substrate 1 to activate the surface of the substrate 1.

FIG. 1B illustrates the step of forming a silicon valley or recess 3 by depositing a photoresistive film PR1, selectively exposing and developing the resist and then etching the semiconductor substrate 1 to a predetermined thickness to form a "U" or step shaped recess 3. The height 'h' of the recess 3 may vary. For example, depending on the memory capacity of the semiconductor memory device.

FIG. 1C illustrates forming a first nonconductor 10a by removing the photoresistive film PR1 and then sputtering an oxide layer. The smaller the thickness of the sputtered oxide layer the better, but the desirable thickness is 60 Å to 180 Å. The use of an oxide having an ONO or NO structure can increase the charge storing capacity for a given thickness.

FIG. 1D illustrates forming a first conductor 10b by depositing, exposing and developing a photoresistive film PR2 so that it is patterned over the area other than over recess 3, and then diffusing an n-type dopant (or a p-type dopant). This dopant zone in which conductor 10b is formed extends into the substrate 1 and to the side of recess 3 within substrate 1.

Once the diffusion is complete, the remaining photoresist PR2 is removed.

FIGS. 2A–2F illustrates forming a common ground conductor 20. Metal conductor forming technology based on lift off processing avoids damage arising during the etching process and makes it possible to easily form a metal conductor. The technology for this lift off processing is described in U.S. Pat. No. 4,218,532 entitled "Photolithographic Technique For Depositing Thin Films" which is hereby expressly incorporated by reference.

The lift off mask for depositing the metal pattern is formed in a sandwich type structure consisting of three layers; a bottom layer 21 (photoresistive film), a middle layer 22 (metal layer), and an upper layer 23 (photoresistive layer) on the substrate. The pattern this three layer structure is then sequentially etched and the metal deposited through the etched path to form ground conductor 20 as described further below.

FIG. 2A illustrates depositing a first photoresistive film as bottom layer 21 on the oxide layer 10a. The principal purpose of forming the bottom layer 21 of the first photoresistive film is to remove the recess 3 and facilitate forming the common ground conductor 20 by providing material from which it will be possible to form an edge in bottom layer 21 that is undercut from the edge of and below middle layer 22 during subsequent processing.

Figure 2B:
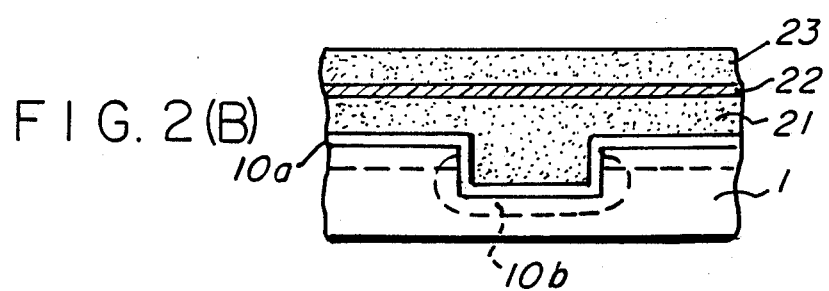

FIG. 2B illustrates forming both middle layer 22 with a metal film and upper layer 23 with a second photoresistive film. The middle layer 22 acts as a mask during subsequent etching, which pattern of the mask can be varied to adjust the degree of undercut of bottom layer 21. The upper layer 23 is used to pattern middle layer 22 and facilitate the removal of the mask after the formation of the common ground conductor 20.

Figure 2C:
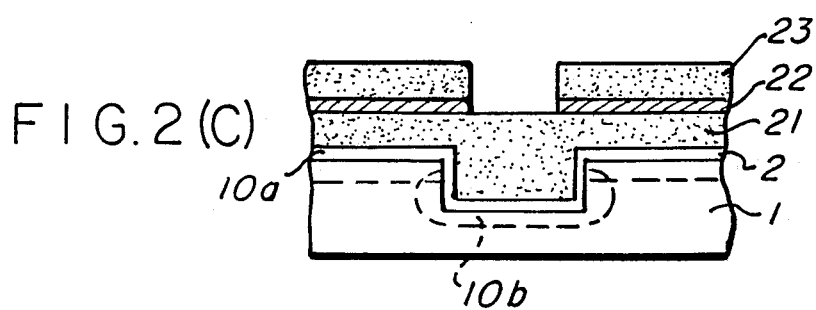

FIG. 2C illustrates forming a window in upper layer 23 and then etching middle layer 22 through the window formed in upper layer 23 to create the pattern desired in middle layer 22.

Figure 2D:
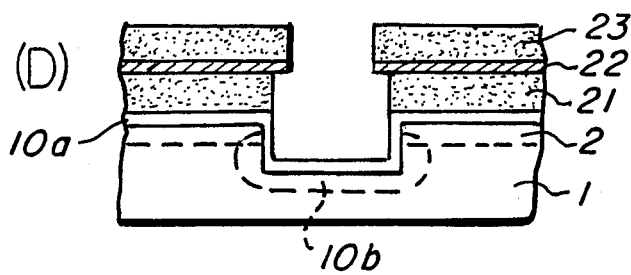

FIG. 2D illustrates etching the bottom layer 21. In this step, a small amount of undercut is provided at the edge formed by bottom layer 21 below middle layer 22. The undercut also facilitates in the removal of the tri-layer mask after the formation of common ground conductor 20.

Figure 2E:
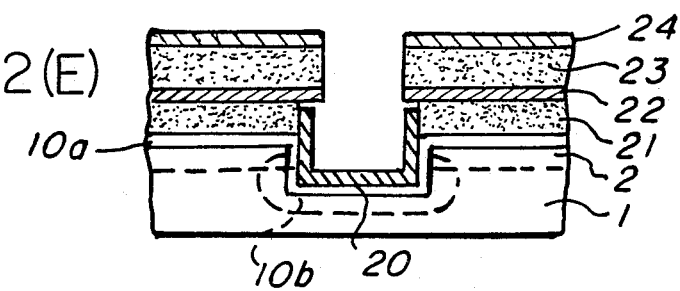

FIG. 2E illustrates forming the common ground conductor 20 by sputtering the metal through the etched paths of the tri-layer mask to form a minute metal pattern having line widths of the order of several hundred Å. An isotropic sputtering process is especially advantageous for depositing the metal pattern on the edge formed by bottom layer 21 to form sidewalls of common ground conductor 21 and the horizontal lower portion of the common ground conductor 20. The horizontal lower portion of the common ground conductor 20 may be formed utilizing an evaporator.

It should be noted that this technology has been previously used only for depositing a metal on a horizontal surface that is ideally at or close to at right angles from the direction the metal being deposited is traveling from the sputtering source. Therefore, it has been previously considered a disadvantage that the metal being deposited will actually travel in a direction that deviates from a path that is at a right angle to the horizontal surface on which a deposit is made. Thus, when attempting to deposit a metal on a horizontal surface at the bottom of a cavity, metal is deposited, although this deposit is not wanted, on the side walls of the cavity. To overcome this problem, various sputtering methods such as anisotropic sputtering are being attempted.

However, the present invention advantageously uses this "disadvantage" to deposit the metal on the side walls of the bottom layer 21 to form the common ground conductor 20 having a "U" shaped metal pattern of several hundred Å. A U shaped metal pattern of this size has been previously thought impossible using conventional technology.

A metal with superior conductivity such as tungsten, titanium or an alloy thereof is preferably used to form common ground conductor 20 that has a thickness between 300–1000 Å. The heights of the sidewalls of common ground conductor 20 can be adjusted depending on the intended application by varying several factors, such as the height 'h' of the recess 3, the degree of undercut in bottom layer 21, the size of the mask window formed in middle layer 22, the isotropic sputtering parameters (such as target height, the surrounding gas, the level of the vacuum), and the thickness of the tri-layer mask.

Figure 2F:
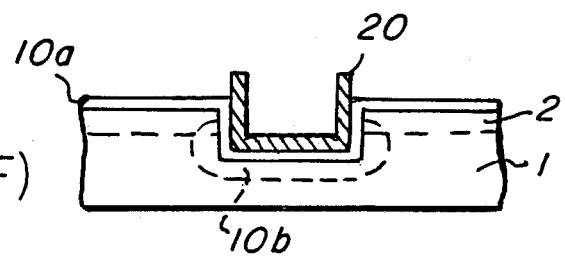

FIG. 2F illustrates the step of removing or lifting off the tri-layer mask, in which the bottom layer 21, the middle layer 22, the upper layer 23 and the conductor layer 24 are totally removed, thereby completing the formation of the desired "U" shaped common ground conductor 20. This removal of the tri-layer mask can be facilitated and removal time saved by irradiating ultraviolet rays or by baking at a predetermined temperature.

Figure 3A:
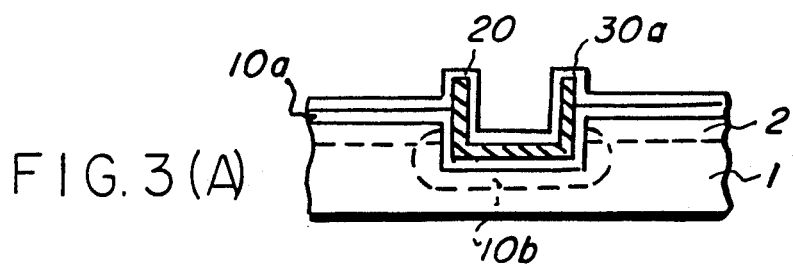

FIG. 3A illustrates forming a second non-conductor 30a by sputtering an oxide layer on the sample of FIG. 2F. The material and the sputtering thickness of the second non-conductor 30a are preferably the same as those of the first non-conductor 10a.

Figure 3B:
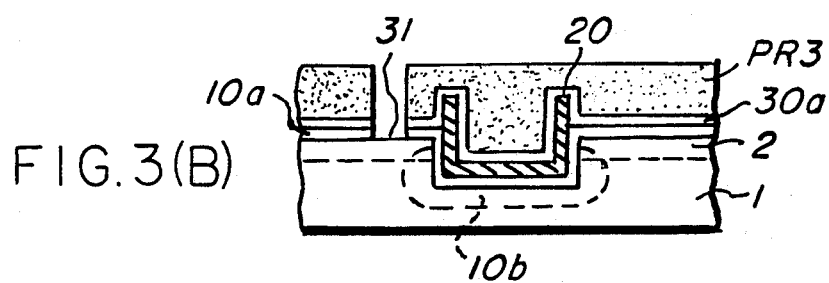

FIG. 3B illustrates forming a connection window 31 for connecting the second capacitor to the circuit element within the semiconductor integrated circuit. The connection window 31 is formed by coating a photoresistive film PR3 over the second non-conductor 30b, exposing portions of photoresistive film PR3, developing photoresistive film PR3, and then etching away the portion of second non-conductor 30b and first non-conductor 10a where the connection window 31 is to be formed.

Figure 3C:
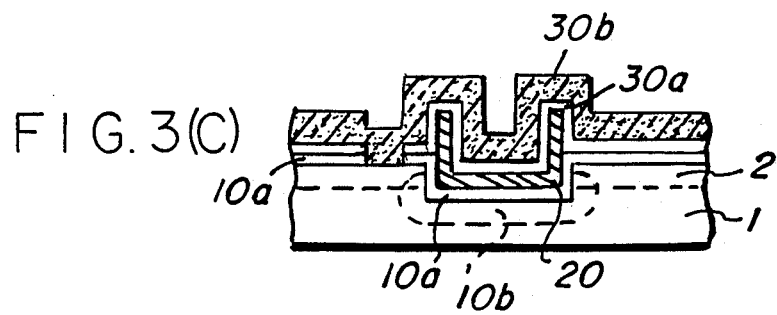

FIG. 3C illustrates forming a second conductor 30b after removal of photoresistive film PR3 by depositing a polycrystal silicon with a thickness of preferably about 2000 Å, thereby completing the forming of the double capacitor according to the present invention.

In the example illustrated the first conductor 10b is completed by depletion region 2 so that a circuit element can be coupled to circuit element terminal, such as transistor source or drain, that is part of the semiconductor integrated circuit. However, other ways of connecting first conductor 10b and second conductor 30b could be provided.

Figure 4:
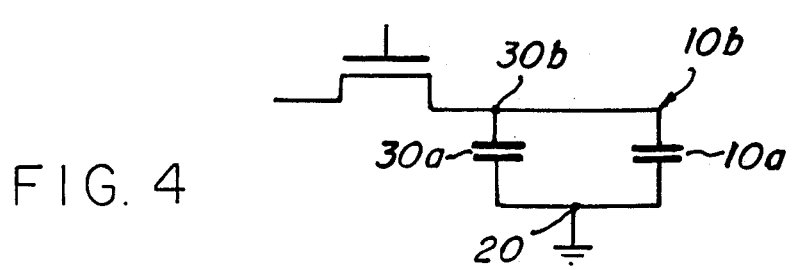
FIG. 4 is a schematic illustration of the equivalent circuit for the double capacitor according to the present invention.

FIG. 4 illustrates an equivalent circuit for the double capacitor according to the present invention that corresponds to the parallel connected double capacitor manufactured in the manner previously described. This double capacitor can then be connected to a circuit element such as a transistor, as illustrated. Specifically illustrated in FIG. 4 is a first capacitor consisting of the first conductor 10b, the first non-conductor 10a and the common ground conductor 20 connected through the first conductor 10b to the transistor and the second capacitor consisting of the second non-conductor 30a, the second conductor 30b and the common ground conductor 20 connected through the second conductor 30b to the transistor, thereby providing two capacitors in parallel connection to a single transistor.

While the invention has been described in connection with what is presently considered to be the most practical and preferred embodiments, it is understood that the invention is not limited to the disclosed embodiment, but, on the contrary, is intended to cover various modifications and equivalent arrangements included within the spirit and scope of the appended claims.

What is claimed is:

1. A double capacitor for a semiconductor integrated circuit capable of being connected to another circuit element comprising:
   a first capacitor comprising:
      a first conductor formed in a substrate below and alongside a recess formed on one side of said substrate,
      a first non-conductor disposed over said first conductor, and
      a common ground conductor having a "U" shape disposed over said first non-conductor and within said recess and having free ends extending beyond said recess; and
   a second capacitor comprising:
      said common ground conductor,
      a second generally M-shaped non-conductor disposed over said common ground conductor, and
      a second conductor disposed over said second non-conductor.

2. A double capacitor according to claim 1 wherein said first and second capacitors are connected in parallel.

3. A double capacitor according to claim 1, wherein said first and second non-conductors are composed of an oxide layer having at least one of a NO and an ONO structure.

4. The double capacitor according to claim 1, wherein said first and second non-conductors have a thickness between 60 and 180 Å.

5. The double capacitor according to claim 1 wherein said first conductor includes a surface of said one side of said substrate doped to contain a depletion region.

6. The double capacitor according to claim 5, wherein said first conductor includes a dopant doped region of the same conductivity type as that of said depletion region below said recess.

7. The double capacitor according to claim 1 wherein said common ground conductor is composed of one of tungsten, titanium, and an alloy of one of said tungsten and titanium.

8. The double capacitor according to claim 1 wherein the thickness of said common ground conductor is 60–180 Å.

9. The double capacitor according to claim 1 wherein the thickness of said second conductor is substantially 2000 Å and is made of polycrystal silicon.

10. A manufacturing method for a double capacitor comprising the steps of:
    etching a portion of a substrate of a predetermined thickness to obtain a recessed area on one side of said substrate;
    depositing an oxide layer over said substrate to form a first non-conductor;
    diffusing a dopant through said recess into said substrate to form a first conductor;
    forming a common ground conductor having substantially a U shape within said recess;
    depositing a second oxide layer over said common ground conductor to form a second non-conductor;
    etching a portion of said first and second non-conductors to provide a connecting area to said first conductor;
    depositing a conductive dopant over said second non-conductor and within said connecting area to form a second conductor electrically connected to said first conductor.

11. A method according to claim 10 further including the step of diffusing said one side of said substrate with a predetermined dopant to form a depletion region that serves as a part of said first conductor.

12. A method according to claim 1, wherein said diffusing step diffuses said dopant partially into said depletion region alongside said recess.

13. A method according to claim 10 wherein said common ground conductor forming step comprises the steps of:
    depositing a tri-layer structure comprising a first photoresistive bottom layer, a metal middle layer, and a second photoresistive upper layer over said first conductor;
    etching away a portion of said tri-layer structure to provide a tri-layer mask; and
    depositing a metal using said tri-layer mask to form said common ground conductor.

14. A manufacturing method according to claim 13 wherein said metal depositing step uses sputtering.

15. A manufacturing method according to claim 13 wherein said metal depositing step uses isotropic sputtering.

16. A method according to claim 13 further comprising the steps of:
    irradiating said tri-layer mask with ultraviolet rays after depositing said metal to facilitate removal of said mask; and
    removing said tri-layer mask.

17. A method according to claim 13 further comprising the steps of:
    baking said tri-layer mask after depositing said metal to facilitate removal of said mask; and
    removing said tri-layer mask.

* * * * *